United States Patent
Alam et al.

(10) Patent No.: US 9,647,660 B1
(45) Date of Patent: May 9, 2017

(54) APPARATUS AND METHOD FOR UNIVERSAL HIGH RANGE LEVEL SHIFTING

(71) Applicant: ARM Limited, Cambridge (GB)

(72) Inventors: Akhtar Waseem Alam, Bangalore (IN); Ashwani Kumar Srivastava, Bangalore (IN); Kunal Girish Bannore, Bangalore (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/230,247

(22) Filed: Aug. 5, 2016

(51) Int. Cl.
*H03L 5/00* (2006.01)
*H03K 19/003* (2006.01)
*H03K 3/356* (2006.01)
*H03K 19/0185* (2006.01)

(52) U.S. Cl.
CPC . *H03K 19/00361* (2013.01); *H03K 3/356113* (2013.01); *H03K 19/018521* (2013.01)

(58) Field of Classification Search
CPC .......... H03K 3/356; H03K 19/018521; H03K 19/00315; H03K 17/102; H03K 3/012
USPC .................. 327/333, 306; 326/61–62, 80–81
See application file for complete search history.

(56) References Cited

U.S. PATENT DOCUMENTS

| | | | | |
|---|---|---|---|---|
| 6,717,452 B2* | 4/2004 | Carpenter | ........ | H03K 19/01852 326/68 |
| 7,129,751 B2* | 10/2006 | Jahan | ............... | H03K 3/356113 326/63 |
| 8,421,516 B2* | 4/2013 | Kumar | ............. | H03K 19/01852 326/62 |

OTHER PUBLICATIONS

Kim, et al.; SLC: Split-Control Level Converter for Dense and Stable Wide-Range Voltage Conversion; Proceedings of the ESSCIRC; IEEE; pp. 478-481; Sep 17, 2012. DOI: 10.1109/ESSCIRC.2012.6341359.

* cited by examiner

*Primary Examiner* — Dinh T Le
(74) *Attorney, Agent, or Firm* — Pramudji Law Group PLLC; Ari Pramudji

(57) ABSTRACT

Apparatus for converting a first input signal from a first voltage domain to an output signal for a second voltage domain, the apparatus configured to operate within the first voltage domain or within the second voltage domain. The apparatus comprising input driver circuitry configured to generate second input signal based on the first input signal and a control signal received by input driver circuitry. The apparatus also comprising selection circuitry configured to generate a selection signal based on the control signal. The apparatus also comprising cross-coupled circuitry configured to generate a level-shifted signal at an intermediate node based on the first input signal, the second input signal, and the selection signal. The cross-coupled circuitry comprises a first pair of parallel transistors and a second pair of parallel transistors. The apparatus further comprising output driver circuitry configured to generate output signal for the second voltage domain based on the level-shifted signal.

20 Claims, 6 Drawing Sheets

UPSHIFTING (Low to High)

| Node | Voltage (when value at input node "A" = 0.81V) (i.e., logic value of 1) | Voltage (when value at input node "A" = 0V) (i.e., logic value of 0) |
|---|---|---|
| "Y" | 3.465 V (i.e., logic value of 1) | 3.68nV ($\approx$ 0 V) (i.e., logic value of 0) |

DOWNSHIFTING (High to Low)

| Node | Voltage (when value at input node "A" = 3.465V) (i.e., logic value of 1) | Voltage (when value at input node "A" = 0V) (i.e., logic value of 0) |
|---|---|---|
| "Y" | 0.81 V (i.e., logic value of 1) | 2.787nV ($\approx$ 0 V) (i.e., logic value of 0) |

… (1)

APPARATUS AND METHOD FOR UNIVERSAL HIGH RANGE LEVEL SHIFTING

TECHNICAL FIELD

The present technique(s) relate to an apparatus, method, and system for universal level shifting with a high range.

BACKGROUND

Current integrated circuit (IC) designs may have circuitry with different components that may operate in different voltage domains. In order for components that operate in one voltage domain of the IC to interact with components that operate in a second voltage domain of the IC, signal conversion may be required. Signal conversion may utilize a "level shifter" in order to take an input signal in one voltage domain and generate a corresponding output signal in the second voltage domain. The signal conversion may have an associated voltage range of conversion. For example, a 1.8V input signal (e.g., logical high) in one voltage domain may be converted to a corresponding 3V output signal (e.g., logical high) in the second voltage domain. In this case, a level shifter may have a range of 1.8V to 3V. Conversion (i.e., level shifting) of further lower voltages of one voltage domain to further higher voltages of another voltage domain (or vice versa), increases the voltage range of a level shifter. Current IC designs have a need for high range signal conversion and corresponding conversion circuitry to accommodate the high range signal conversion.

A difficulty encountered by conversion circuitry that tries to convert a very low voltage signal to a very high voltage signal (e.g., high range conversion) is an issue of state instability. For example, during operation, components of the conversion circuitry may not always achieve a stable state but rather may encounter meta-stability where a state is achieved irrespective of the input. Such state instability (e.g., meta-stability) of components results in a corresponding instability of data states which cannot be relied upon. Another consideration is that circuitry for the conversion of a low voltage signal to a high voltage signal (e.g., up-shifting) is designed separately from the circuitry for the conversion of a high voltage signal to a low voltage signal (e.g., down-shifting). The use of different conversion circuitry for the up-shifting and down-shifting signal conversions (e.g., high range signals) may result in a more complex and less efficient design process and/or design flow for IC's utilizing signal conversion circuitry.

Consequently, there is the need for a conversion circuitry that can accommodate different voltage domains and different shifting operations that are performed as part of a high range signal conversion. Furthermore, there is a need that such conversion circuitry may provide reliable stability of data states as part of the high range signal conversion.

BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, or apparatuses described herein.

FIG. 4A is a table illustrating exemplary results associated with an apparatus in accordance with a particular embodiment described herein;

FIG. 4B is another table illustrating exemplary results associated with an apparatus in accordance with another embodiment described herein;

DETAILED DESCRIPTION

Figure 1:
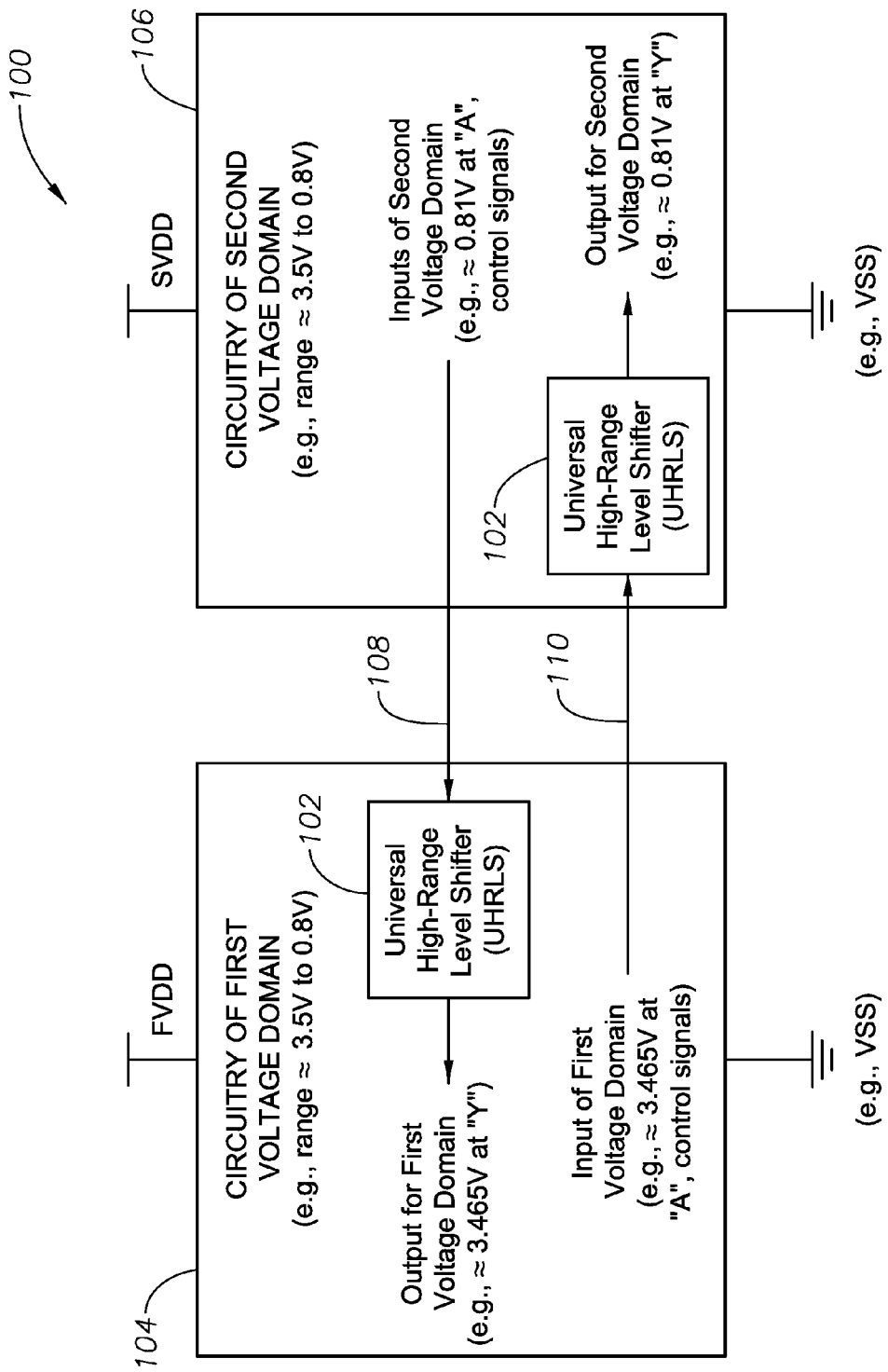
FIG. 1 is a block diagram illustrating a system for converting an input signal from a first voltage domain to an output signal for a second voltage domain in accordance with the present techniques, apparatuses, and methods described herein.

Before discussing the embodiments with reference to the accompanying figures, a brief description of various embodiments is provided.

In one embodiment, an apparatus for converting a first input signal from a first voltage domain to an output signal for a second voltage domain is described herein. The apparatus is configured to operate within the first voltage domain or within the second voltage domain. The apparatus includes input driver circuitry configured to generate a second input signal based on the first input signal and a control signal received by the input driver circuitry. The apparatus also includes selection circuitry configured to generate a selection signal based on the control signal. The apparatus also includes cross-coupled circuitry configured to generate a level-shifted signal at an intermediate node based on the first input signal, the second input signal, and the selection signal. The cross-coupled circuitry includes a first pair of parallel transistors and a second pair of parallel transistors. The apparatus further includes output driver circuitry configured to generate the output signal for the second voltage domain based on the level-shifted signal.

In another embodiment, a method for converting a first input signal from a first voltage domain to an output signal for a second voltage domain is described herein. The method is performed within the first voltage domain or within the second voltage domain. The method includes receiving the first input signal and a control signal. The method also includes generating a second input signal based on the first input signal and the control signal. The method also includes generating a selection signal based on the control signal. The method also includes generating a level-shifted signal at an intermediate node based on the first input signal, the second input signal, and the selection signal. The first input signal and the second input signal are received by a first pair of parallel transistors and a second pair of parallel transistors. The method further includes generating the output signal for a second voltage domain based on the level-shifted signal.

In another embodiment, there is provided a system for converting a first input signal from a first voltage domain to an output signal for a second voltage domain as described herein. The system includes a means operable in the first voltage domain. The system also includes means operable in the second voltage domain. The system also includes means for converting the first input signal. The means for converting includes means for generating a second input signal based on the first input signal and a control signal received by the means for generating. The means for converting also includes means for generating a selection signal based on the control signal. The means for converting also includes means for generating a level-shifted signal at an intermediate node based on the first input signal, the second input signal, and the selection signal. The means for generating the level-shifted signal includes a first pair of parallel transistors and a second pair of parallel transistors. The means for converting further includes means for generating the output signal for a second voltage domain based on the level-shifted signal. The means for converting is configured to operate within the first voltage domain or within the second voltage domain.

An integrated circuit (IC) may comprise various components (e.g., functional blocks) that may each perform specific operations (with the execution of associated instructions). The various components may be located in different voltage domains of the IC. The communication/exchange of signals between different voltage domains may require signal conversion of a high range where signals from a very low voltage domain are converted (e.g., up-shifted) to a very high voltage domain, and signals from a very high voltage domain are converted (e.g., down-shifted) to a very low voltage domain. Such conversions may be limited by conversion circuitry component's ability to achieve a stable state for input data conversions. For example, an input signal of a first voltage domain may have a voltage that is much lower than a voltage of a second voltage domain. The low voltage input signal to be converted may not enable a sufficient gate-source voltage (Vgs) for one or more transistor components of the conversion circuitry (e.g., level shifter) that is part of the higher voltage domain. As a consequence, the one or more transistor components of the circuitry may encounter state instability (e.g., meta-stability). Such state instability may result in a corresponding instability of data states for the conversion circuitry. Conversion circuitry utilizing a cross-coupled design may be susceptible to insufficient Vgs voltages and a corresponding data state instability. The apparatuses and methods described herein may mitigate the insufficiency of Vgs voltages of conversion circuitry and mitigate the corresponding data state instability. The apparatuses and methods described herein may be integrated with the components of an IC to provide state stable circuitry for the conversion of an input signal of a first voltage domain (e.g., high or low voltage domain) to an output signal of a second voltage domain (e.g., high or low voltage domain), and vice versa.

Such apparatuses and methods may improve the reliability and integrity of data signals being converted by conversion circuitry. Additionally, it would be advantageous to provide an apparatus and method that is universal as to shifting operations performed as part of a high range signal conversion and universal as to the different voltage domains in which signal conversion occurs. For example, in a non-limiting embodiment, an apparatus may be configured to operate within different voltages domains that have different supply voltages. The difference between the supply voltages may be substantial so as to accommodate a high range of signal conversion. In another non-limiting embodiment, the apparatus may enable a signal conversion that includes the performing of one of an up-shift operation and a down-shift operation based on the input signal received by the apparatus. For example the apparatus may be utilized within a high voltage domain to receive a low voltage signal and to perform an up-shifting operation for converting the low voltage signal to a high voltage signal. The apparatus may also be utilized within a low voltage domain to receive a high voltage signal and to perform a down-shifting operation for converting the high voltage signal to a low voltage signal. In this manner, an apparatus of single design can accommodate both shifting operations for differing voltage domains. Such universality of the apparatus and associated method described herein may reduce the complexity and resource usage for conversion circuitry and may enable increased efficiency of the design process and/or design flow for IC's utilizing signal conversion circuitry.

The apparatuses and methods described herein may be process independent such that they may be applied to various process technologies. For example, the apparatuses and methods may be applied to current process technologies and any future process technologies having reduced process geometries. Additionally, the apparatuses and methods may be the result of or associated with various lithographic techniques such as, but not limited to, extreme ultra violet lithography, nanoimprint lithography, multiple patterning lithography, and magneto lithography, and various chemical lithography. The apparatuses and methods described herein may be applied to process technologies that implement various types of devices such as, but not limited to, planar devices, multi-gate devices (e.g., FinFET devices), or a combination of both.

The apparatuses and methods described herein may be associated with one or more standard cells of a process technology so as to enable the automated design of an integrated circuit (IC) with signal conversion capability. To illustrate, a standard design flow may provide netlists (e.g., schematic level and/or layout level netlists) that include the apparatuses used for converting an input signal from a first voltage domain to an output signal for a second voltage domain. Such netlists may be associated with modules (e.g., power management modules, signal management modules, etc.) of the IC design. Alternatively or in addition, the apparatuses and methods described herein may be associated with of one or more engineering change order (ECO) steps used to make changes to a standard design flow. For example, a standard design flow may be modified utilizing ECO steps to provide modified netlists that include the apparatuses used for the signal conversion described herein.

Particular embodiments will now be described with reference to the figures.

Referring to FIG. 1, a block diagram illustrating a system for converting an input signal from a first voltage domain to an output signal for a second voltage domain in accordance with apparatuses, methods, and techniques described herein is shown and generally designated 100. The system 100 includes a first voltage domain 104 having a first power supply (FVDD) that may be configured to have a voltage that is included in a voltage range of 3.5V to 0.8V (e.g., a supply voltage of 3.5V, 3.3V, 2.5V, 1.8V, 1.2V, 0.95V, 0.9V, 0.81V, 0.8V, or other voltage value within the range). The first voltage domain 104 also includes a first grounding power supply (e.g., VSS) that may have a value of 0V or may be configured to have a voltage that is less than the first supply voltage (FVDD). The first voltage domain 104 also comprises an apparatus, such as a universal high range level shifter (UHRLS) 102, for high range signal conversion. The first voltage domain 104 also comprises circuitry that can operate using the first power supply and that may utilize an output signal generated by the apparatus 102. In a particular embodiment, the circuitry that may operate within the first voltage domain 104 may include, but is not limited to, a master power controller of the system 100.

The system 100 includes a second voltage domain 106 having a second power supply (SVDD) that may be configured to have a voltage that is included in the voltage range of 3.5V to 0.8V (e.g., a supply voltage of 3.5V, 3.3V, 2.5V, 1.8V, 1.2V, 0.95V, 0.9V, 0.81V, 0.8V, or other voltage value within the range). The second voltage domain 106 also includes a second grounding power supply that may be the same as the first grounding supply (e.g., VSS). The second grounding power supply may have a value of 0V or may be configured to have a voltage that is less than the second supply voltage (SVDD). The second voltage domain 106 also comprises the apparatus UHRLS 102, for high range signal conversion. The second voltage domain 106 also comprises circuitry that can operate using the second power supply and that may utilize an output signal generated by the apparatus 102. In a particular embodiment, the circuitry that may operate within the second voltage domain 106 may include, but is not limited to, a subsystem power controller of the system 100. Alternatively, the subsystem power controller may operate within the first voltage domain 104 while the master power controller may operate within the second voltage domain 106. It is to be understood that the voltage range (e.g., 0.8V to 3.5V) described herein is an exemplary voltage range and that other voltage ranges are contemplated for signal conversions associated with the apparatus 102 and system 100.

The system 100 may be associated with one or more IC's. For example, the first voltage domain 104 and the second voltage domain 106 of the system 100 and their respective circuitries may be associated with a single IC. In another embodiment, the first voltage domain 104 may be associated with a first IC and the second voltage domain 106 may be associated with another IC. The system 100 having the first and the second voltage domains 104 and 106, may utilize multiple apparatuses 102 to achieve signal conversion between differing voltage domains. Accordingly, the apparatus 102 is designed and may be configured to operate within different voltage domains. Furthermore, the apparatus 102 is designed with the ability to perform different types of signal conversion operations, such as an up-shift operation and a down-shift operation. In this manner, the apparatus 102 (e.g., UHRLS) is designed to be universal with regard to voltage domains (e.g., able to accommodate multiple supply voltages of differing voltage domains) and to be universal with regard to signal conversion operations (e.g., able to perform up-shift and down-shift operations).

During operation of the system 100, signals that are to be shared, exchanged, communicated between the first voltage domain 104 and the second voltage domain 106 may require signal conversion. Such signal conversion is achieved utilizing the apparatus 102 in which an input signal of a first voltage domain (e.g., high or low voltage domain) is converted to an output signal of a second voltage domain (e.g., high or low voltage domain), or vice versa.

The conversion may include performing one of an up-shift operation and a down-shift operation based on the input signal received by the apparatus 102. For example, in a particular case that is part of performing the up-shift operation, the input signal may have a voltage of the first voltage domain that is less than a voltage of the second voltage domain.

In another case involving the up-shift operation (e.g., the operation 108 of FIG. 1), the input signal may have a voltage of the second voltage domain that is less than a voltage of the first voltage domain. For example, in a particular embodiment of this case, an input signal (e.g., an input A) may have a low voltage (e.g., 0.81V) of the second voltage domain 106. The low voltage may represent a logic high (e.g., logic value of 1) of the input signal. The input signal may be converted to an output signal (e.g., an output Y) having a high voltage (e.g., 3.465V) of the first voltage domain 104. The high voltage representing a logic high (e.g., logic value of 1) of the output signal. The apparatus 102 within the first voltage domain 104 may receive the input signal from the second voltage domain 106 and perform an up-shift operation (e.g., the operation 108) in order to achieve the signal conversion. The generated output signal having the high voltage (e.g., 3.465V) representing the logic high (e.g., logic value of 1) may be available to various circuitry operating within the first voltage domain 104.

Similarly, in another embodiment the input signal may be associated with a down-shift operation (e.g., the operation 110 of FIG. 1). In the case of performing the down-shift operation, the input signal may have a voltage of the first voltage domain that is greater than a voltage of the second voltage domain. To illustrate, the input signal (e.g., an input A) may have a high voltage (e.g., 3.465V) of the first voltage domain 104. The high voltage may represent a logic high (e.g., logic value of 1) of the input signal. The input signal may be converted to an output signal (e.g., an output Y) having a low voltage (e.g., 0.81V) of the second voltage domain 106. The low voltage of the output signal representing a logic high (e.g., logic value of 1) of the output signal. The apparatus 102 within the second voltage domain 106 may receive the input signal from the first voltage domain 104 and perform a down-shift operation (e.g., the operation 110) in order to achieve the signal conversion. The generated output signal having the low voltage (e.g., 0.81V) representing the logic high (e.g., logic value of 1) may be available to various circuitry operating within the second voltage domain 106.

In a similar manner, the conversion (e.g., down-shift and up-shift operations) of an input signal of a voltage domain to an output signal of another voltage domain may be applied to input signals having a voltage value that represents a logic low (e.g., logic value of 0). For example, the input signal (e.g., input signal A) may have a voltage value (e.g., 0V) of the first voltage domain. The voltage value representing a logic low signal (e.g., logic 0). The input signal may be converted to a voltage value (e.g., 0V) of the second voltage domain that represents the logic low signal. Alternatively or in addition, the logic low input signal having a voltage value (e.g., 0V) of the first voltage domain may be up-shifted to a higher voltage value (e.g., VSS having a voltage greater than 0V) of the second voltage domain that represents the logic low signal. In another embodiment, the logic low input signal having a voltage value (e.g., 0V) of the first voltage domain may be down-shifted to a lower voltage value (e.g., VSS having a voltage less than 0V) of the second voltage domain that represents the logic low signal.

The apparatus (e.g., UHRLS) 102 of the system 100 may receive one or more control signals from control circuitry (not shown) of the IC. The control circuitry may be within the same voltage domain as that of the apparatus 102 or may be located in a different voltage domain. The one or more controls signals may enable the selection and operation of the apparatus 102 for signal conversion. For example, the control circuitry may provide the one or more controls signals (e.g., signal EN) to circuitry associated with the apparatus 102. To illustrate, the one or more controls signals may be received by input drive circuitry and selection circuitry that are part of the apparatus 102. In another embodiment, the one or more controls signals may be received by input drive circuitry and selection circuitry that are coupled to the apparatus 102 but located within a voltage domain that is different from the voltage domain of the apparatus 102.

It is to be understood that the system 100 and apparatus 102 (and associated operations and methods) are not limited to the specific embodiments described above and illustrated by FIG. 1, but may also be applied to other voltages of a voltage range and other operation scenarios of the voltage domains 104 and 106. For example, the input signal may have a voltage (e.g., 1.8V) from the voltage range (e.g., 0.8V through 3.5V) that may be up-shifted to a higher voltage (e.g., 3.3V) within the voltage range or may be down-shifted to a lower voltage (e.g., 1.2V) within the voltage range. Furthermore, the down-shift and up-shift operations may be performed in the different voltage domains (e.g., voltage domains 104 and 106). To illustrate, the second voltage domain 106 may have an input signal with a high voltage (e.g., 3.465V) of the second voltage domain 106 to be down-shifted to an output signal with a low voltage (e.g., 0.81V) of the first voltage domain 104. Similarly, the first voltage domain 104 may have an input signal with a low voltage (e.g., 0.81V) of the first voltage domain 104 to be up-shifted to an output signal with a high voltage (e.g., 3.465V) of the second voltage domain 106.

In this manner, the apparatus 102 of single design can universally accommodate both shifting operations for differing voltages of differing voltage domains of the system 100. This universality of the apparatus 102 may reduce the complexity for signal conversion circuitry for increased design process/flow efficiency. Furthermore, the apparatus 102 may include circuit components that provide data state stability during signal conversion which may result in increased data reliability for signal conversion within the system 100.

Figure 2:
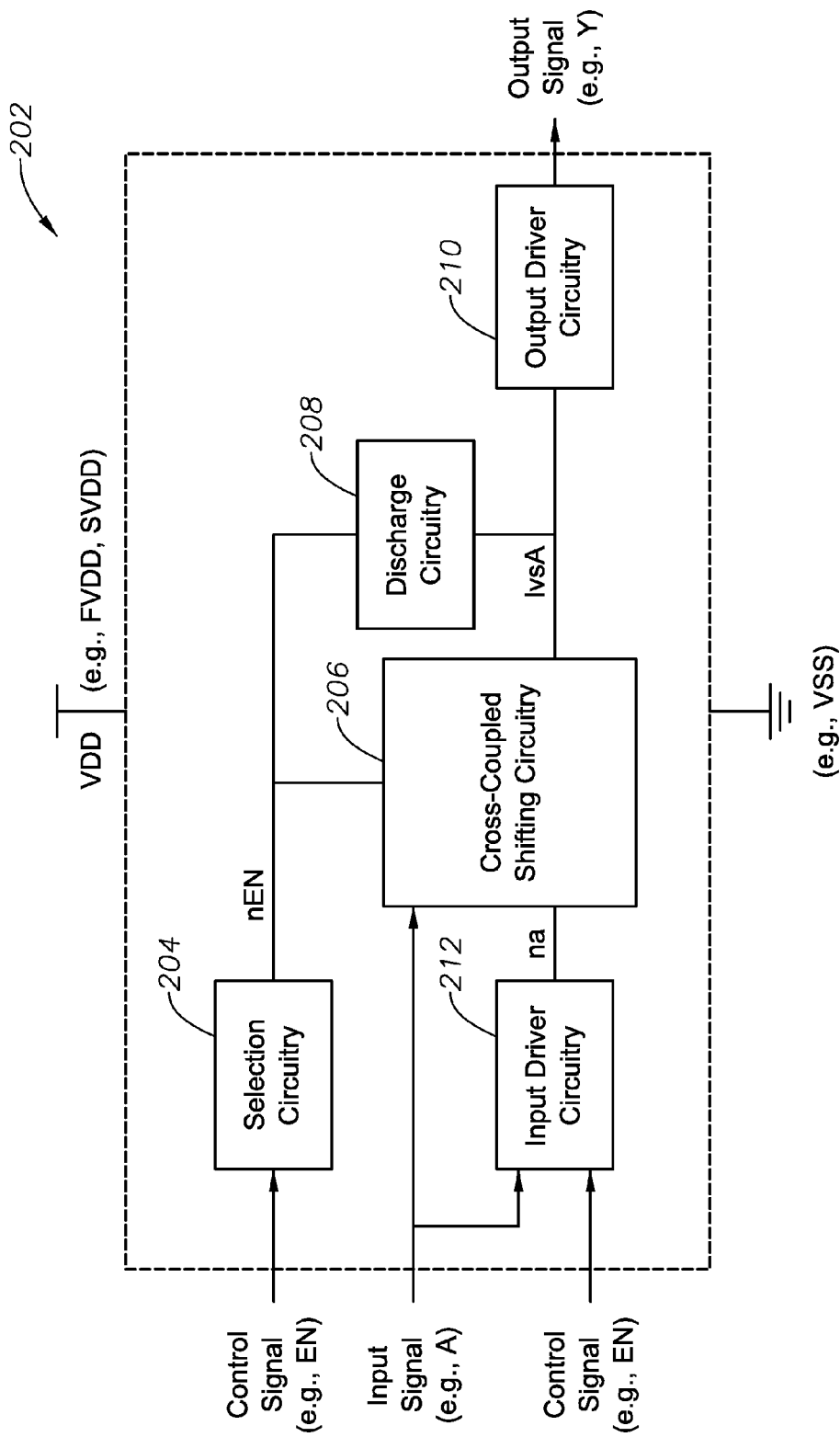
FIG. 2 is a block diagram illustrating an apparatus for converting an input signal from a first voltage domain to an output signal for a second voltage domain in accordance with embodiments described herein.

Referring to FIG. 2, a block diagram schematically illustrating an apparatus for converting an input signal from a first voltage domain to an output signal for a second voltage domain is shown and generally designated 202. The apparatus 202 includes a power supply (VDD) of a voltage domain in which the apparatus 202 is located. In this manner, the power supply of the apparatus 202 may be VDD of the first voltage domain (FVDD) or may be VDD of the second voltage domain (SVDD) depending on the voltage domain the apparatus 202 is located. The power supply may be configured to have a voltage that is included in a voltage range of 3.5V to 0.8V (e.g., a supply voltage of 3.5V, 3.3V, 2.5V, 1.8V, 1.2V, 0.95V, 0.9V, 0.81V, 0.8V, or other voltage value within the range). The apparatus 202 may have grounding power supply (e.g., VSS) similar to the grounding power supplies described for the first and second voltage domains 104 and 106, respectively of FIG. 1. The grounding power supply of the apparatus 202 may be configured to have a value of 0V, a voltage less than 0V, or a voltage greater than 0V but less than the supply voltage (e.g., VDD).

The apparatus 202 may include input driver circuitry 212, selection circuitry 204, crossed-coupled shifting circuitry 206, discharge circuitry 208, and output driver circuitry 210. The apparatus 202 may enable the conversion of an input signal (e.g., input signal A) from a first voltage domain to an output signal (e.g., output signal Y) for a second voltage domain. The apparatus 202 may be the apparatus (e.g., UHRLS) 102 of FIG. 1 and may have substantially the same operations and/or configurations as described for the apparatus 102 of FIG. 1.

The input driver circuitry 212 may be configured to generate a second input signal (e.g., second input signal na) based on the input signal (e.g., input signal A) and a control signal (e.g., control signal EN) received by the input driver circuitry 212. For example, input driver 212 may be coupled to the crossed-coupled shifting circuitry 206. The input driver 212 may receive the input signal and the control signal and based on the logic values (and corresponding voltage values) of the input and control signals, the input driver 212 may generate the second input signal (e.g., signal na). The input driver 212 may subsequently drive the generated second input signal (e.g., signal na) to be received by the crossed-coupled shifting circuitry 206. In a particular embodiment, the input driver 212 may be coupled to the crossed-coupled shifting circuitry 206 but may be located within a voltage domain that is different from the voltage domain of the apparatus 202. In this case, the second signal may be generated in one voltage domain and received by the crossed-coupled shifting circuitry 206 of apparatus 202 that is within a different voltage domain.

The selection circuitry 204 may be configured to generate a selection signal (e.g., selection signal nEN) based on the control signal (e.g., control signal EN). For example, the selection circuitry 204 may be coupled to the crossed-coupled shifting circuitry 206 and may be coupled to the discharge circuitry 208. The selection circuitry 204 may receive the control signal and based on the logic value (and corresponding voltage value) of the control signal, the selection circuitry 204 may generate the selection signal (e.g., signal nEN). The selection circuitry 204 may subsequently drive the generated selection signal to be received by the crossed-coupled shifting circuitry 206 and the discharge circuitry 208.

The crossed-coupled shifting circuitry 206 may be configured to generate a level-shifted signal (e.g., signal lvsA) at an intermediate node based on the input signal (e.g., signal A), the second input signal (e.g., signal na), and the selection signal (e.g., signal nEN). For example, the crossed-coupled shifting circuitry 206 may be coupled to the input driver circuitry 212, to the selection circuitry 204, to the discharge circuitry 208, and coupled to the output driver circuitry 210. The crossed-coupled shifting circuitry 206 may receive the input signal (e.g., signal A), the second input signal (e.g., signal na), and the selection signal (e.g., signal nEN). Based on the logic values (and corresponding voltage values) of the input signal, the second input signal, and the selection signal, the crossed-coupled shifting circuitry 206 may generate the level-shifted signal (e.g., lvsA). The crossed-coupled shifting circuitry 206 may subsequently drive the generated level-shifted signal to be received by the output driver circuitry 210. In a particular embodiment, the cross-coupled circuitry 206 may include, among other components, a first pair of parallel transistors and a second pair of parallel transistors.

The discharge circuitry 208 may be configured to discharge current from an intermediate node (e.g., a setting of the intermediate node to a ground or VSS voltage value) of the apparatus 202. For example, the discharge circuitry 208 may be coupled to the crossed-coupled shifting circuitry 206, the selection circuitry 204, and the output driver 210. The discharge circuitry 208 may receive the selection signal and based on the logic value (and corresponding voltage value) of the selection signal, the discharge circuitry 208 may discharge current from an intermediate node of the apparatus 202.

The output driver circuitry 210 may be configured to generate the output signal (e.g., output signal Y) for the second voltage domain based on the level-shifted signal (e.g., signal IvsA). For example, the output driver circuitry 210 may be coupled to the crossed-coupled shifting circuitry 206, and to the discharge circuitry 208. The output driver circuitry 210 may receive the level-shifted signal and based on the voltage value (and corresponding logic value) of the level-shifted signal, the output driver circuitry 210 may generate the output signal (e.g., output signal Y) for the second voltage domain.

In a particular embodiment, the input driver circuitry 212, the selection circuitry 204, the cross-coupled shifting circuitry 206, the discharge circuitry 208, and the output driver circuitry 210 may each be comprised of thick gate oxide (TGO) transistors. The TGO transistors may be p-channel and/or n-channel metal oxide semiconductor transistors (e.g., PMOS and/or NMOS transistors). In this manner, the apparatus 202 comprising TGO transistors may perform the signal conversions describe herein and may reduce current leakage that is associated with the signal conversions performed by the apparatus 202. In another embodiment, the apparatus 202 may be part of a standard cell library of a process technology associated with the IC.

During operation, the apparatus 202 may provide signal conversion in which an input signal of a first voltage domain (e.g., high or low voltage domain) is converted to an output signal of a second voltage domain (e.g., high or low voltage domain), or vice versa. The conversion may include performing one of an up-shift operation and a down-shift operation based on the input signal received. To illustrate a particular case that is part of the up-shift operation, the input signal may have a voltage of the first voltage domain that is less than a voltage of the second voltage domain. For example, a logic high input signal (e.g., signal A) that has a low voltage (e.g., 0.81V) of a first voltage domain may be converted (e.g., via an up-shift operation) to a higher voltage (e.g., 3.465V) of a second voltage domain. For this case, the input driver circuitry 212 and the selection circuitry 204 may both receive the control signal (e.g., signal EN) that has a logic high value (and corresponding voltage value). The control signal may activate the input driver circuitry 212. The selection circuitry 204 may use the control signal to generate a selection signal (e.g., signal nEN) that is the inverse (e.g., a logic low value) of the control signal. The generated selection signal may activate the crossed-coupled shifting circuitry 206 and deactivate the discharge circuitry 208. The input driver circuitry 212 and the crossed-coupled shifting circuitry 206 may both receive the input signal (e.g., signal A). The input driver circuitry 212 may use the input signal to generate a second input signal (e.g., signal na) that is the inverse of the input signal (e.g., signal A). The activated crossed-coupled shifting circuitry 206 may convert (e.g., in this case via an up-shift operation) the input signal to generate a level-shifted signal (e.g., signal IvsA). The output driver circuitry 210 may receive the level-shifted signal to generate an output signal (e.g., signal Y of FIG. 2). The output driver circuitry 210 may drive the output signal (e.g., signal Y) for receipt by one or more components of the second voltage domain. In this manner, the apparatus 202 may enable signal conversion of an input signal of a first voltage domain to an output signal of a second voltage domain.

In a similar manner, the apparatus 202 may accommodate other operational cases and the conversion of other voltage values within a voltage range (e.g., a conversion range) between voltage domains. For example, the input signal may be associated with a down-shift operation (e.g., the operation 110 of FIG. 1). In the case of performing the down-shift operation, the input signal may have a voltage of the first voltage domain that is greater than a voltage of the second voltage domain. Accordingly, the apparatus 202 may enable the up-shifting and down-shifting conversion of input signals from a first voltage domain to a second voltage domain or vice versa. The conversion may accommodate various voltage values within a high (i.e., wide) voltage range. To illustrate, the apparatus 202 may be associated with a voltage range (e.g., a conversion range) that includes the voltages approximately equal to and between 0.8 volts and 3.5 volts. Other voltage ranges that are wider (e.g., have voltages lower than 0.8 and/or voltages higher than 3.5V) are also contemplated for signal conversion by the apparatus 202.

The apparatus 202 may be of a single design that can universally accommodate both shifting operations (e.g., up-shift and down-shift operations) for differing voltages of differing voltage domains (e.g., the voltage domains 104 and 106 of FIG. 1). This universality of the apparatus 102 may reduce the cost and complexity for signal conversion circuitry and reduce the cost and complexity for an associated standard cell library. Such reductions in cost and complexity may enable increased efficiency for a design process/flow of an IC design. Additionally, the apparatus 202 may include circuitry that provides data state stability during signal conversion operations. Such state stability may increase data reliability associated with the signal conversion, as further described in reference to FIG. 3.

Figure 3:
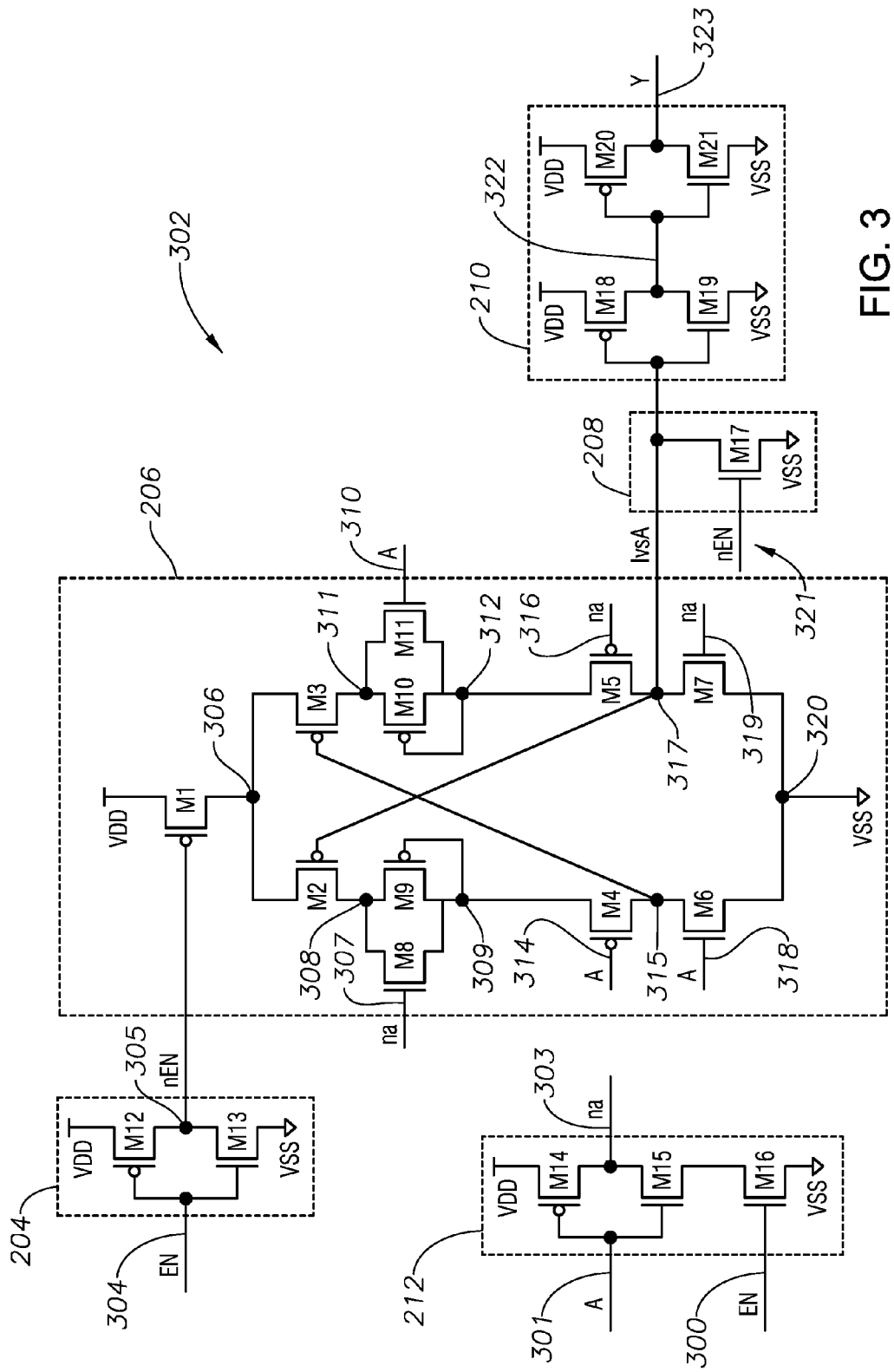
FIG. 3 is a circuit diagram schematically illustrating an apparatus for converting an input signal from a first voltage domain to an output signal for a second voltage domain in accordance with embodiments described herein.

Referring to FIG. 3, a circuit diagram schematically illustrating an exemplary design of an apparatus for converting an input signal from a first voltage domain to an output signal for a second voltage domain is shown and generally designated 302. The apparatus 302 includes a power supply (VDD) and a grounding power supply (VSS) of a voltage domain in which the apparatus 302 is located. The power supply and grounding power supply of the apparatus 302 may be similar to the power supplies described for the apparatus 102 or 202 of FIGS. 1 and 2, respectively. Furthermore, the power supply of the apparatus 302 and may be configured to have a voltage within a range similar to that described for the apparatus 102 or 202 of FIGS. 1 and 2, respectively.

The apparatus 302 may include input driver circuitry 212, selection circuitry 204, crossed-coupled shifting circuitry 206, discharge circuitry 208, and output driver circuitry 210. The apparatus 302 may enable the conversion of an input signal (e.g., input signal A) from a first voltage domain to an output signal (e.g., output signal Y) for a second voltage domain. The apparatus 302 may be the apparatus (e.g., UHRLS) 102 of FIG. 1 or the apparatus 202 of FIG. 2 and may have substantially the same operations and/or configurations as described for the apparatuses 102 and 202 of FIGS. 1 and 2, respectively. In a manner similar to that described for apparatus 2 of FIG. 2, the apparatus 302 may be comprised of NMOS and PMOS transistors that are each thick gate oxide (TGO) transistors. In this manner, the apparatus 302 may reduce current leakage associated with the components of the apparatus 302 while performing the signal conversions described herein. In another embodiment, the apparatus 302 may be part of a standard cell library of a process technology associated with an IC. The apparatus 302 may be the apparatus (e.g., UHRLS) 102 of FIG. 1 or the apparatus 202 of FIG. 2 and may have substantially the same operations and/or configurations as described for the apparatuses 102 and 202 of FIGS. 1 and 2, respectively.

The crossed-coupled shifting circuitry 206 may include a first PMOS transistor (M1), a second PMOS transistor (M2), a third PMOS transistor (M3), a fourth PMOS (M4) transistor, a fifth PMOS transistor (M5), a first NMOS transistor (M6), a second NMOS transistor (M7), a first pair of parallel transistors (M8 and M9), and a second pair of parallel transistors (M10 and M11). The first pair of parallel transistors includes a third NMOS transistor (M8) coupled in parallel to a sixth PMOS transistor (M9). The second pair of parallel transistors includes a seventh PMOS transistor (M10) coupled in parallel to a fourth NMOS transistor (M11).

The first PMOS transistor (M1) may be coupled to the power supply (VDD). The first PMOS transistor (M1) may also be coupled to the second PMOS transistor (M2) and to the third PMOS transistor (M3) at a node 306. A gate terminal of the first PMOS transistor (M1) may be coupled to the selection circuitry 204 at node 305 and may receive a selection signal (e.g., signal nEN) from the selection circuitry 204 (via node 305). The first pair of parallel transistors (M8 and M9) may be coupled between the second PMOS transistor (M2, via node 308) and the fourth PMOS transistor (M4, via node 309). The second pair of parallel transistors (M10 and M11) may be coupled between the third PMOS transistor (M3, via node 311) and the fifth PMOS transistor (M5, via node 312). The second PMOS transistor (M2) may have a gate terminal cross-coupled to an intermediate node 317 between the fifth PMOS transistor (M5) and the second NMOS transistor (M7). The third PMOS transistor (M3) may have a gate terminal cross-coupled to a node 315 between the fourth PMOS transistor (M4) and the first NMOS transistor (M6). The first NMOS transistor (M6) and the second NMOS transistor (M7) may be coupled to the grounding power supply (VSS) at a node 320.

In a particular embodiment, the first pair of parallel transistors (M8 and M9), and the second pair of parallel transistors (M10 and M11) may enable transistors of the crossed-coupled shifting circuitry 206 to have stable data states for input signal conversions. For example, for high range signal conversion, components of conversion circuitry may be limited in their ability to achieve a stable data state particularly for an input signal that has a low voltage compared to the voltage the input is to attain by conversion. To illustrate, a low voltage input signal to be converted may not enable a sufficient gate-source voltage (Vgs) for one or more transistor components of a conversion circuitry that is part of the higher voltage domain. As a consequence, the one or more transistor components of the circuitry may encounter state instability (e.g., meta-stability) resulting in corresponding instability of data states. The use and design of the first pair of parallel transistors and second pair of parallel transistors within the apparatus 302 may enable a gate-source voltage (Vgs) for one or more PMOS transistors of the cross-coupled circuitry 206 that is sufficient to enable an avoidance of a meta-stable state for the one or more PMOS transistors. To illustrate, a particular example may involve signal conversion of the input signal (e.g., signal A) that has a low voltage (e.g., 0.81V) to be up-shifted to a higher voltage output signal. The PMOS transistors (M9) and (10) of the first pair and second pair of parallel transistors (respectively) may lower the voltage at the node 309 so as to enable a PMOS transistor (e.g., transistor M4) to have a sufficient Vgs voltage so as to avoid state instability for proper operation. Similarly, for down-shifting of a high voltage input signal to a low voltage output signal, the NMOS transistors (M8) and (11) of the first pair and second pair of parallel transistors (respectively) may enable PMOS transistors (e.g., transistors M4, M5) to have a sufficient Vgs voltage to avoid state instability for proper operation.

Accordingly, the first pair of parallel transistors and second pair of parallel transistors within the apparatus 302 may reduce state instability associated with high range signal conversion so as to improve the reliability and integrity of data signals being converted by the apparatus 302. Furthermore, the apparatus 302 having the first pair and second pair of parallel transistors provides a universal design to accommodate both up-shifting and down-shifting operations performed as part of a high range signal conversion. Further still, the apparatus 302 provides a universal design to accommodate the different voltage domains in which signal conversion may occur.

The crossed-coupled shifting circuitry 206 may receive the input signal (e.g., signal A), the second input signal (e.g., signal na), and the selection signal (e.g., signal nEN). For example, the input signal (e.g., signal A) may be received by a gate terminal 314 of the fourth PMOS transistor (M4), by a gate terminal 318 of the first NMOS transistor (M6), and by a gate terminal 310 of the fourth NMOS transistor (M11) of the second pair of parallel transistors. Additionally, the second input signal (e.g., signal na) may be received by a gate terminal 316 of the fifth PMOS transistor (M5), by a gate terminal 319 of the second NMOS transistor (M7), and by a gate terminal 307 of the third NMOS transistor (M8) of the first pair of parallel transistors. Furthermore, the selection signal (e.g., signal nEN) may be received by a gate terminal of the first PMOS transistor (M1), via node 305. The crossed-coupled shifting circuitry 206 may be configured to generate a level-shifted signal (e.g., signal IvsA) at the intermediate node 317 based on the input signal (e.g., signal A), the second input signal (e.g., signal na), and the selection signal (e.g., signal nEN). In the absence of signal conversion operations (e.g., deactivation of input circuitry 212), the control signal (e.g., EN) may have a logic 0 value (and corresponding voltage value) and the selection circuitry 204 may generate the selection signal (e.g., signal nEN) with a logic 1 value (and corresponding voltage value) to deactivate the cross-coupled shifting circuitry 206.

The selection circuitry 204 may include a first inverter having an output coupled to the cross-coupled shifting circuitry 206 at node 305 and an input to receive the control signal (e.g., signal EN) at node 304. For example, the first inverter may include a PMOS transistor (M12) and an NMOS transistor (M3). The first inverter may be coupled to the power supply (VDD) and to the grounding power supply (VSS) of a voltage domain in which the apparatus 302 is located. The selection circuitry 204 may be configured generate the selection signal (e.g., signal nEN) based on the control signal (e.g., signal EN). The selection signal may be the inverse (e.g., an inverse logic value and corresponding voltage value) of the control signal.

The input driver circuitry 212 may include a second inverter having an output coupled (not shown) to the cross-coupled shifting circuitry 206 at node 303 (e.g., coupled to the gate terminals 316, 319, and 307). The second inverter may have an input to receive the input signal (e.g., signal A) at node 301. For example, the second inverter may include a PMOS transistor (M14) and an NMOS transistor (M15). The second inverter may be coupled to the power supply (VDD) of a voltage domain in which the apparatus 302 is located. The input driver circuitry 212 may include an NMOS transistor (M16) that is coupled to the second inverter and to the grounding power supply (VSS) of a voltage domain in which the apparatus 302 is located. The NMOS transistor (M16) may have a gate terminal 300 that may receive the control signal (e.g., signal EN). The input driver circuitry 212 may be configured to generate the second input signal (e.g., signal na) based on the input signal (e.g., signal A) and the control signal (e.g., signal EN). The generated second input signal (e.g., signal na) may be the signal received by the gate terminals 316, 319, and 307, of transistors M5, M7, and M8, respectively, of the cross-coupled shifting circuitry 206. In the absence of signal conversion operations (e.g., deactivation cross-coupled shifting circuitry 206), the control signal (e.g., EN) may have a logic 0 value (and corresponding voltage value) to deactivate the input driver circuitry 212 via deactivation of M16.

The discharge circuitry 208 may include a discharging NMOS transistor (M17) coupled to the crossed-coupled shifting circuitry 206 and to the output driver circuitry 210 at the node 317. The discharging NMOS transistor (M17) may be coupled to the grounding power supply (VSS) of a voltage domain in which the apparatus 302 is located. The discharging NMOS transistor (M17) may have a gate terminal that may receive the selection signal (e.g., signal nEN) from the selection circuitry 204. The discharge circuitry 208 may be configured to discharge current from the intermediate node 317 (e.g., a setting of the intermediate node to a ground or VSS voltage value) based on the selection signal. For example, for signal conversion operations, a control signal (e.g., EN) may have a logic 1 value (and corresponding voltage value) and the selection circuitry 204 may generate the selection signal (e.g., signal nEN) with a logic 0 value (and corresponding voltage value) to deactivate the discharge circuitry 208. In the absence of signal conversion operations (e.g., deactivation of input circuitry 212 and cross-coupled shifting circuitry 206), the control signal (e.g., signal EN) may have a logic 0 value (and corresponding voltage value) and the selection circuitry 204 may generate the selection signal (e.g., signal nEN) with a logic 1 value (and corresponding voltage value) to activate the discharge circuitry 208.

The output driver circuitry 210 may include a third inverter having an input coupled to the cross-coupled circuitry 206 at node 317. The input of the third inverter may receive the level-shifted signal (e.g., signal IvsA) via node 317. The output driver circuitry 210 may also include a fourth inverter having an input coupled to the third inverter at node 322 to receive an intermediate shifted signal. The fourth inverter having an output node 323 to provide the output signal (e.g., signal Y) for the second voltage domain. For example, the third inverter may include a PMOS transistor (M18) and an NMOS transistor (M19). The fourth inverter may include a PMOS transistor (M20) and an NMOS transistor (M21). The third inverter and the fourth inverter may each be coupled to the power supply (VDD) and to the grounding power supply (VSS) of the voltage domain in which the apparatus 302 is located. The output driver circuitry 210 may be configured to generate the output signal (e.g., signal Y) for the second voltage domain based on the level-shifted signal (e.g., signal IvsA).

During operation, the apparatus 302 may provide signal conversion in which an input signal of a first voltage domain (e.g., high or low voltage domain) is converted to an output signal of a second voltage domain (e.g., high or low voltage domain), or vice versa. The conversion may include performing one of an up-shift operation and a down-shift operation based on the input signal received. For example, the apparatus 302 may perform the up-shifting operations as described with reference to the apparatus 202 of FIG. 2. Accordingly, the apparatus 302 may enable signal conversion of an input signal of a first voltage domain to an output signal of a second voltage domain.

The apparatus 302 may accommodate other operational cases (e.g., up-shift and down-shift operations) and the conversion of other voltage values within a voltage range (e.g., a conversion range) between voltage domains as described with reference to the apparatus 202 of FIG. 2. For example, the apparatus 302 may be associated with a voltage range (e.g., a conversion range) that includes the voltages approximately equal to and between 0.8 volts and 3.5 volts. Other voltage ranges that are wider (e.g., have voltages lower than 0.8 and/or voltages higher than 3.5V) are also contemplated for signal conversion by the apparatus 302.

The apparatus 302 may be designed to provide data state stability during signal conversion operations which may result in increased data reliability associated with signal conversions. Additionally, the apparatus 302 may be of a single design that can universally accommodate both shifting operations (e.g., up-shift and down-shift operations) for differing voltages of differing voltage domains (e.g., the voltage domains 104 and 106 of FIG. 1). Such universality may reduce cost and complexity for signal conversion circuitry, may reduce cost and complexity for an associated standard cell library, and may enable increased efficiency for a design process/flow of an IC design.

Referring to FIG. 4A, a table illustrating exemplary results associated with an apparatus for converting an input signal from a first voltage domain to an output signal for a second voltage domain is shown and generally designated 401. Table 401 illustrates exemplary results associated with an up-shifting operation performed by an apparatus (e.g., the apparatus 102, 202, and 302 of FIGS. 1-3, respectively) described herein. The exemplary results are voltage results for an output signal (e.g., output signal Y) when an input signal (e.g., input signal A) holds particular voltage values (corresponding to either a logic value 1 or a logic value 0). Table 401 illustrates that when the input signal (e.g., signal A) holds a voltage value (e.g., 0.81V) of a particular voltage domain (e.g., a first voltage domain) corresponding to a logic value of 1, the up-shifting operation may result in the output signal (e.g., signal Y) having an up-shifted voltage value (e.g., 3.465V) of another voltage domain (e.g., a second voltage domain). Table 401 also illustrates that when the input signal holds a voltage value (e.g., 0V) of a particular voltage domain (e.g., a first voltage domain) corresponding to a logic value of 0, the up-shifting operation may result in the output signal having a voltage value (e.g., approximately 0V) of another voltage domain (e.g., a second voltage domain). The exemplary results of table 401 may correspond to operational results of the apparatus 102, 202, and/or 302 of FIGS. 1-3, respectively. The exemplary results of table 401 may also correspond to results of method(s) described herein (e.g., a method 500 described in relation to FIG. 5).

Referring to FIG. 4B, another table illustrating exemplary results associated with an apparatus for converting an input signal from a first voltage domain to an output signal for a second voltage domain is shown and generally designated 402. Table 402 illustrates exemplary results associated with a down-shifting operation performed by the apparatus (e.g., the apparatus 102, 202, and 302 of FIGS. 1-3, respectively) described herein. The exemplary results are voltage results for an output signal (e.g., output signal Y) when an input signal (e.g., input signal A) holds particular voltage values (corresponding to either a logic value 1 or a logic value 0). Table 402 illustrates that when the input signal holds a voltage value (e.g., 3.465V) of a particular voltage domain (e.g., a first voltage domain) corresponding to a logic value of 1, the down-shifting operation may result in the output signal having a down-shifted voltage value (e.g., 0.81V) of another voltage domain (e.g., a second voltage domain). Table 402 also illustrates that when the input signal holds a voltage value (e.g., 0V) of a particular voltage domain (e.g., a first voltage domain) corresponding to a logic value of 0, the down-shifting operation may result in the output signal having a voltage value (e.g., approximately 0V) of another voltage domain (e.g., a second voltage domain). The exemplary results of table 402 may correspond to operational results of the apparatus 102, 202, and/or 302 of FIGS. 1-3, respectively. The exemplary results of table 402 may also correspond to results of method(s) described herein (e.g., a method 500 described in relation to FIG. 5).

Figure 5:
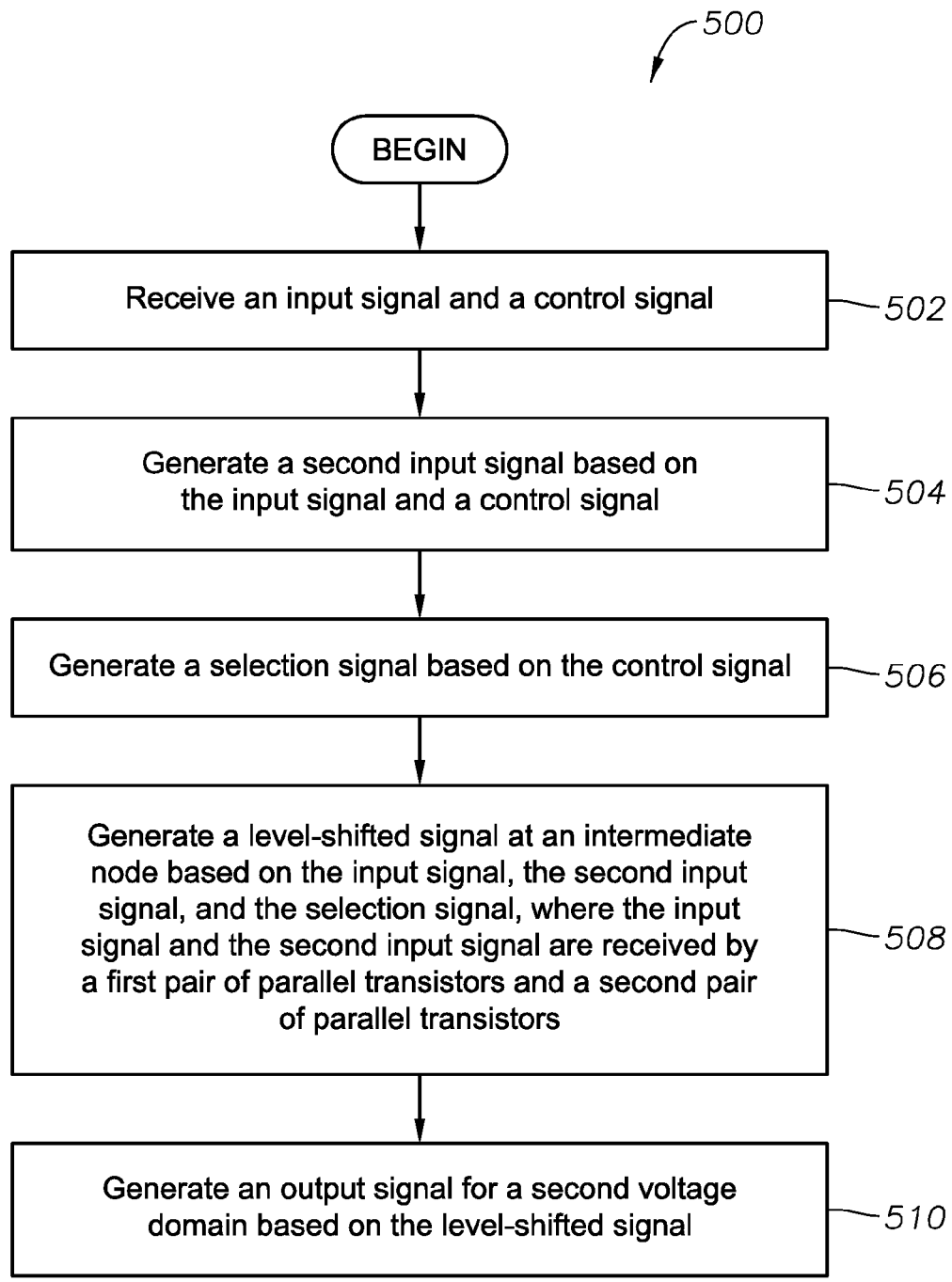
FIG. 5 is a flow chart that illustrates a method for converting an input signal from a first voltage domain to an output signal for a second voltage domain in accordance with embodiments described herein.

Referring to FIG. 5, a flow chart that illustrates a particular embodiment of a method for converting an input signal from a first voltage domain to an output signal for a second voltage domain in accordance with embodiments described herein is shown and generally designated 500. The method 500 may be performed within the first voltage domain or within the second voltage domain. The method 500 includes receiving an input signal and a control signal at 502. For example, an input signal (e.g., input signal A) and a control signal (e.g., control signal EN) may be received by input driver circuitry (e.g., circuitry 212 of FIGS. 2 and 3) of an apparatus (e.g., the apparatus 102, 202, and 302 of FIGS. 1-3, respectively) described herein. The control signal may be provided by control circuitry (not shown) associated with the apparatus. The input signal may also be received by cross-coupled circuitry (e.g., circuitry 206 of FIGS. 2 and 3) and the control signal may also be received by selection circuitry (e.g., circuitry 204 of FIGS. 2 and 3). The control signal may be associated with the activation/deactivation of the input driver circuitry, the cross-coupled circuitry, and a discharging circuitry (e.g., circuitry 208 of FIGS. 2 and 3) of the apparatus, as part of converting the input signal from a first voltage domain to the output signal for a second voltage domain (e.g., the first and second voltage domains 104 and 106, respectively).

The method 500 also includes generating a second input signal based on the input signal and the control signal, at 504. For example, the control signal (e.g., control signal EN) may be received by the input driver circuitry (e.g., circuitry 212 of FIGS. 2 and 3) of an apparatus (e.g., the apparatus 102, 202, and 302 of FIGS. 1-3, respectively) described herein. The control signal may have a logic value (e.g., logic 1) and corresponding voltage value to enable activation of the input driver circuitry. Upon activation, the input driver circuitry may generate a second input signal (e.g., signal na) that is the inverse (e.g., inverse voltage and logic values) of the input signal (e.g., input signal A). The input driver circuitry may drive the second input signal for receipt by the cross-coupled circuitry (e.g., circuitry 206 of FIGS. 2 and 3).

The method 500 also includes generating a selection signal based on the control signal, at 506. For example, the control signal (e.g., control signal EN) may be received by selection circuitry (e.g., circuitry 204 of FIGS. 2 and 3) of an apparatus (e.g., the apparatus 102, 202, and 302 of FIGS. 1-3, respectively) described herein. The control signal may have a logic value (e.g., logic 1) and corresponding voltage value. The selection circuitry may generate a selection signal (e.g., signal nEN) that is the inverse of the control signal (e.g., logic 0 and corresponding voltage value). The selection circuitry may drive the selection signal for receipt by the cross-coupled circuitry (e.g., circuitry 206 of FIGS. 2 and 3) and for receipt by a discharge circuitry (e.g., circuitry 208 of FIGS. 2 and 3).

The method 500 also includes generating a level-shifted signal at an intermediate node based on the input signal, the second input signal, and the selection signal, where the input signal and the second input signal are received by a first pair of parallel transistors and a second pair of parallel transistors, at 508. For example, the selection signal (e.g., signal nEN) may be received by the cross-coupled circuitry (e.g., circuitry 206 of FIGS. 2 and 3) of an apparatus (e.g., the apparatus 102, 202, and 302 of FIGS. 1-3, respectively) described herein. The control signal may have a logic value (e.g., logic 1) and corresponding voltage value. The selection signal may have a logic value (e.g., logic 0 and corresponding voltage value) that enables the activation of the cross-coupled circuitry. During this activation, the cross-coupled circuitry may receive the input signal (e.g., input signal A) and the second input signal (e.g., signal na). To illustrate, the second input signal may be received by a transistor of a first pair of parallel transistors (e.g., transistors M8 and M9 of FIG. 3 that are coupled in parallel) of the cross-coupled circuitry. Additionally, the input signal may be received by a transistor of a second pair of parallel transistors (e.g., transistors M10 and M11 of FIG. 3 that are coupled in parallel) of the cross-coupled circuitry. Other components of the cross-coupled circuitry may also receive the input signal and the second input signal. During activation and receipt of the input signal and the second input signal, the cross-coupled circuitry may generate a level-shifted signal (e.g., signal IvsA of FIGS. 2 and 3) at an intermediate node (e.g., node 317 of FIG. 3). The cross-coupled circuitry may provide the level-shifted signal for receipt by an output driver circuitry (e.g., circuitry 210 of FIGS. 2 and 3).

The method 500 also includes generating an output signal for a second voltage domain based on the level-shifted signal, at 510. For example, the level-shifted signal (e.g., signal IvsA of FIGS. 2 and 3) generated by the cross-coupled circuitry may be received by output driver circuitry (e.g., circuitry 210 of FIGS. 2 and 3) of an apparatus (e.g., the apparatus 102, 202, and 302 of FIGS. 1-3, respectively) described herein. The output driver circuitry may generate the output signal (e.g., signal Y of FIGS. 2 and 3) at an output node (e.g., node 323 of FIG. 3). The output driver circuitry may drive the output signal for receipt by one or more components of the second voltage domain.

It is to be understood that the method 500 may accommodate different operational cases (e.g., up-shift and down-shift operations) and the conversion of various voltage values within a voltage range (e.g., a conversion range) between differing voltage domains as described with reference to FIGS. 2 and 3. For example, the conversion of the method 500 may include performing one of an up-shift operation and a down-shift operation based on the input signal received by of an apparatus (e.g., the apparatus 102, 202, and 302 of FIGS. 1-3, respectively). To illustrate, when performing the up-shift operation as a part of the method 500, the input signal may have a voltage of the first voltage domain that is less than a voltage of the second voltage domain. Similarly, when performing the down-shift operation as a part of the method 500, the input signal may have a voltage of the first voltage domain that is greater than a voltage of the second voltage domain.

In a particular embodiment, the steps of method 500 may be associated with the up-shift and down-shift operations described herein for the conversion of an input signal from the second voltage domain to an output signal for the first voltage domain. In such a case, the step at 510 may enable the generation of an output signal for the first voltage domain based on the level-shifted signal. The method 500 may also be associated with a voltage range (e.g., a conversion range) that includes the voltages approximately equal to and between 0.8 volts and 3.5 volts. Other voltage ranges that are wider (e.g., have voltages lower than 0.8 and/or voltages higher than 3.5V) are also contemplated for the signal conversion provided by the method 500.

The method 500 may be associated with the operations, characteristics, and/or results described for the apparatuses 102, 202, and/or 302 of FIGS. 1-3, respectively. For example, the method 500 may be associated with providing data state stability during signal conversion operations to result in increased data reliability associated with the signal conversions. Additionally, the method 500 may be associated with a single design that can universally accommodate both shifting operations (e.g., up-shift and down-shift operations) for differing voltages of differing voltage domains (e.g., the voltage domains 104 and 106 of FIG. 1) so as to reduce cost and complexity for signal conversion circuitry, for associated standard cell libraries, and for increased efficiency for a design process/flow of an IC design.

Figure 6:
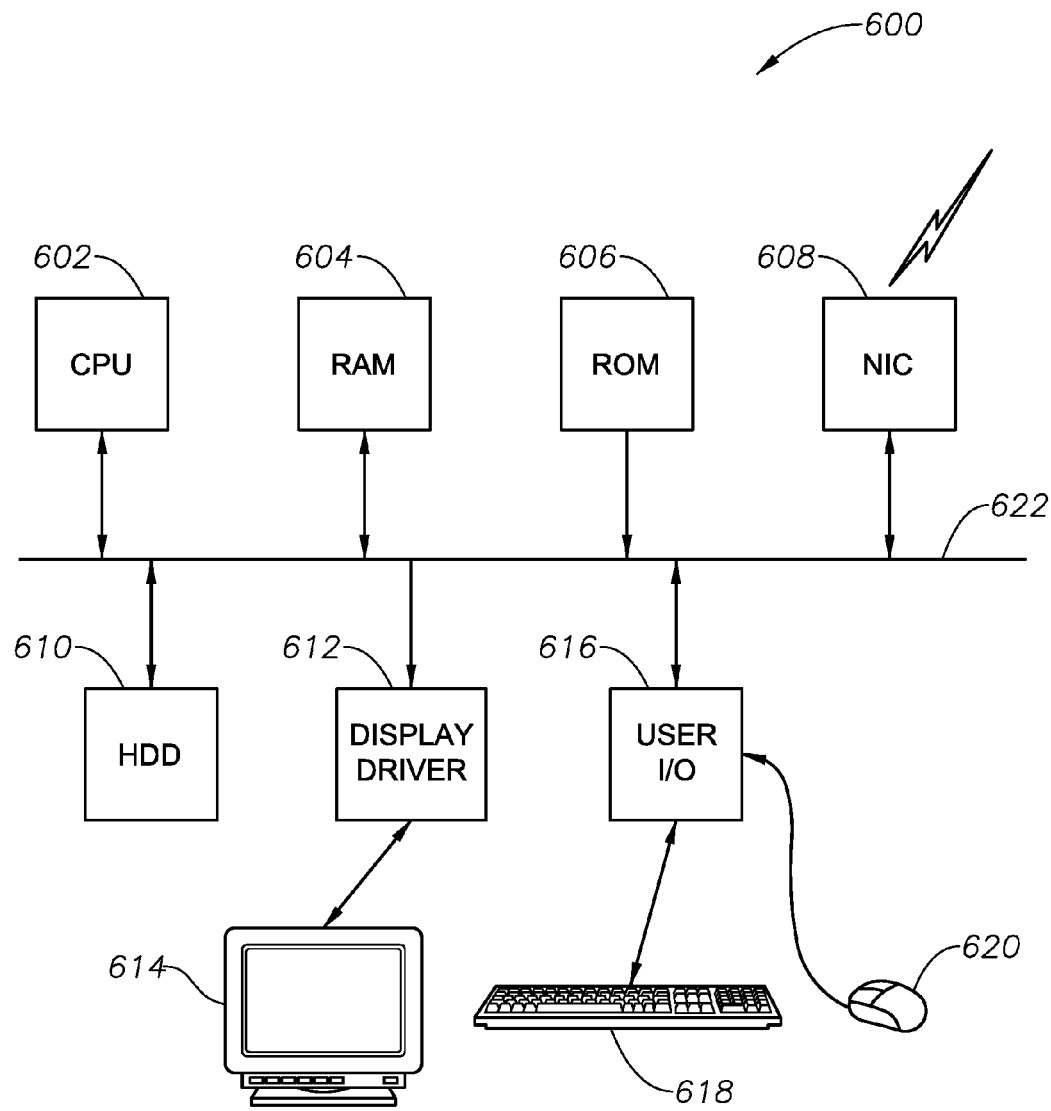
FIG. 6 illustrates a block diagram of a computer system in accordance with implementations of the present techniques, apparatuses, systems, and methods described herein.

Referring to FIG. 6, a block diagram schematically illustrating a general purpose computer of the type that may be used to implement the above described apparatuses, methods and techniques is shown and generally designated 600. The general purpose computer 600 includes a central processing unit 602, a random access memory 604, a read-only memory 606, a network interface card 608, a hard disk drive 610, a display driver 612, a user input/output circuit 616 with a keyboard 618 and mouse 620, and a monitor 614 all connected via a common bus 622. In operation the central processing unit 602 will execute computer program instructions that may be stored in one or more of the random access memory 604, the read-only memory 606 and the hard disk drive 610, or dynamically downloaded via the network interface card 608. The results of the processing performed may be displayed to a user via the display driver 612 and the monitor 614. User inputs for controlling the operation of the general purpose computer 600 may be received via the user input/output circuit 616 from the keyboard 618 or the mouse 620. It will be appreciated that the computer program could be written in a variety of different computer languages. The computer program may be stored and distributed on a recording medium or dynamically downloaded to the general purpose computer 600.

When operating under control of an appropriate computer program, the general purpose computer 600 can include the above described apparatuses (e.g., the apparatuses 102, 202, and/or 302 of FIGS. 1-3, respectively) and perform the above described methods and techniques (e.g., the method 500 of FIG. 5) and can be considered to form a particular apparatus for performing the above described methods and techniques. For example, the particular apparatus may include the system 100 of FIG. 1 or may be one or more components of the system 100 of FIG. 1. The architecture of the general purpose computer 600 could vary considerably, and FIG. 6 is only one example Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope of the invention as defined by the appended claims. For example, various combinations of the features of the dependent claims could be made with the features of the independent claims without departing from the scope of the present invention.

The invention claimed is:

1. An apparatus for converting an first input signal from a first voltage domain to an output signal for a second voltage domain, the apparatus configured to operate within the first voltage domain or within the second voltage domain, the apparatus comprising:
   input driver circuitry configured to generate a second input signal based on the first input signal and a control signal received by the input driver circuitry;
   selection circuitry configured to generate a selection signal based on the control signal;
   cross-coupled circuitry configured to generate a level-shifted signal at an intermediate node based on the first input signal, the second input signal, and the selection signal, wherein the cross-coupled circuitry comprises a first pair of parallel transistors and a second pair of parallel transistors; and
   output driver circuitry configured to generate the output signal for the second voltage domain based on the level-shifted signal.

2. The apparatus of claim 1, wherein the apparatus further comprises discharge circuitry configured to discharge the intermediate node based on the selection signal.

3. The apparatus of claim 1, wherein the cross-coupled circuitry further comprises:
   a first PMOS transistor, a second PMOS transistor, a third PMOS transistor, a fourth PMOS transistor, and a fifth PMOS transistor;
   a first NMOS transistor and a second NMOS transistor.

4. The apparatus of claim 3, wherein the first pair of parallel transistors comprises a third NMOS transistor coupled in parallel to a sixth PMOS transistor, and wherein the second pair of parallel transistors comprises a fourth NMOS transistor coupled in parallel to a seventh PMOS transistor.

5. The apparatus of claim 1, wherein the first pair of parallel transistors and the second pair of parallel transistors enable a gate-source voltage (Vgs) for one or more PMOS transistors of the cross-coupled circuitry, wherein the gate-source voltage is sufficient to enable avoidance of a metastable state for the one or more PMOS transistors.

6. The apparatus of claim 1, wherein the input driver circuitry, the selection circuitry, the cross-coupled circuitry, the discharge circuitry, and the output driver circuitry each comprise thick gate oxide (TGO) transistors.

7. The apparatus of claim 1, wherein converting the first input signal includes performing one of an up-shift operation and a down-shift operation based on the first input signal received by the apparatus.

8. The apparatus of claim 7, wherein when performing the up-shift operation includes the first input signal having a voltage of the first voltage domain that is less than a voltage of the second voltage domain.

9. The apparatus of claim 7, wherein when performing the down-shift operation includes the first input signal having a voltage of the first voltage domain that is greater than a voltage of the second voltage domain.

10. The apparatus of claim 1, wherein the selection circuitry comprises a first inverter having an output coupled to the cross-coupled circuitry and an input to receive the control signal;

wherein the input driver circuitry comprises a second inverter having an output coupled to the cross-coupled circuitry and an input to receive the first input signal; and wherein the output driver comprises:
- a third inverter having an input coupled to the cross-coupled circuitry to receive the level-shifted signal; and
- a fourth inverter having an input coupled to the third inverter and an output to provide the output signal for the second voltage domain, wherein the input of the fourth inverter receives an intermediate shifted signal.

11. The apparatus of claim 1, wherein the apparatus is associated with a conversion range that includes the voltages approximately equal to and between 0.8 volts and 3.5 volts.

12. The apparatus of claim 1, wherein the apparatus is part of a standard cell library of a process technology.

13. A method for converting a first input signal from a first voltage domain to an output signal for a second voltage domain, the method performed within the first voltage domain or within the second voltage domain, the method comprising:
- receiving the first input signal and a control signal;
- generating a second input signal based on the first input signal and the control signal;
- generating a selection signal based on the control signal;
- generating a level-shifted signal at an intermediate node based on the first input signal, the second input signal, and the selection signal, wherein the first input signal and the second input signal are received by a first pair of parallel transistors and a second pair of parallel transistors;
- generating the output signal for a second voltage domain based on the level-shifted signal.

14. The method of claim 13, wherein converting the first input signal includes performing one of an up-shift operation and a down-shift operation based on the first input signal received.

15. The method of claim 14, wherein when performing the up-shift operation includes the first input signal having a voltage of the first voltage domain that is less than a voltage of the second voltage domain.

16. The method of claim 14, wherein when performing the down-shift operation includes the first input signal having a voltage of the first voltage domain that is greater than a voltage of the second voltage domain.

17. A system for converting a first input signal from a first voltage domain to an output signal for a second voltage domain, the system comprising:
- means operable in the first voltage domain;
- means operable in the second voltage domain;
- means for converting the first input signal comprising:
  - means for generating a second input signal based on the first input signal and a control signal received by the means for generating;
  - means for generating a selection signal based on the control signal;
  - means for generating a level-shifted signal at an intermediate node based on the first input signal, the second input signal, and the selection signal, wherein the means for generating the level-shifted signal comprises a first pair of parallel transistors and a second pair of parallel transistors; and
  - means for generating the output signal for a second voltage domain based on the level-shifted signal, wherein the means for converting is configured to operate within the first voltage domain or within the second voltage domain.

18. The system of claim 17, wherein converting the first input signal includes performing one of an up-shift operation and a down-shift operation based on the first input signal received by the means for converting.

19. The system of claim 18,
wherein when performing the up-shift operation includes the first input signal having a voltage of the first voltage domain that is less than a voltage of the second voltage domain, and
wherein when performing the down-shift operation includes the first input signal having a voltage of the first voltage domain that is greater than a voltage of the second voltage domain.

20. The system of claim 17, wherein the means operable in the first voltage domain is a master power controller of the system and the means operable in the second voltage domain is a subsystem power controller of the system.

* * * * *